(12) United States Patent
Lee

(10) Patent No.: US 6,778,009 B1
(45) Date of Patent: Aug. 17, 2004

(54) HIGH GAIN AND WIDE BANDWIDTH SWITCHED CAPACITOR AMPLIFIER HAVING A DYNAMICALLY LOADED AMPLIFIER OUTPUT

(75) Inventor: Bumha Lee, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 160 days.

(21) Appl. No.: 10/286,073

(22) Filed: Oct. 31, 2002

(51) Int. Cl.[7] .................................................. H03F 1/02
(52) U.S. Cl. ............................... 330/9; 330/69; 327/124
(58) Field of Search .............................. 330/9, 51, 69, 330/107, 109; 327/124

(56) References Cited

U.S. PATENT DOCUMENTS 5,410,270 A * 4/1995 Rybicki et al. ................ 330/9
5,805,019 A * 9/1998 Shin ............................... 330/9
6,169,427 B1   1/2001 Brandt ........................ 327/94
6,400,220 B1 * 6/2002 Wang et al. ................... 330/9

* cited by examiner

*Primary Examiner*—Henry Choe
(74) *Attorney, Agent, or Firm*—Mark R. Hennings; Merchant & Gould

(57) ABSTRACT

A switched capacitor amplifier provides high gain and wide bandwidth using dynamic loading. Dynamic loading is used to reduce the capacitive load during a high gain phase (e.g., during a sampling phase) and to increase the capacitive loading during a high feedback factor phase (e.g., during a holding phase). The capacitive load may be provided by an external capacitive load such as a sampling capacitor of a subsequent stage or sampling device. A low feedback factor provides a high voltage gain and the lower capacitive load. A high feedback factor increases the effective bandwidth of the amplifier by compensating for a unit gain bandwidth reduction that is due to high capacitive loading.

20 Claims, 6 Drawing Sheets

HIGH GAIN AND WIDE BANDWIDTH SWITCHED CAPACITOR AMPLIFIER HAVING A DYNAMICALLY LOADED AMPLIFIER OUTPUT

FIELD OF THE INVENTION

The present invention relates generally to electronic amplifiers, and more particularly to switched capacitor circuit amplifiers.

BACKGROUND OF THE INVENTION

Advances in analog signal processing require high voltage gain amplifiers that are capable of amplifying a small input signal with a high voltage gain to increase the dynamic range of analog signal processing blocks. The high voltage gain amplifiers should also minimize the quantization noise level of any analog-to-digital converter in an analog signal processing block. The high voltage gain amplifier requires a large amount of bias current, which increases power dissipation and the power noise level that is required for achieving a high voltage gain.

SUMMARY OF THE INVENTION

The present invention is directed towards a switched capacitor high voltage gain amplifier circuit. According to one aspect of the invention, the switched capacitor high voltage gain amplifier circuit comprises a first, second, and third capacitor and an amplifier. The first capacitor is configured to store a sampled charge that is associated with an input signal during a sampling phase and transfer the sampled charge during a holding phase. The second capacitor is configured to discharge during the sampling phase and provide a first capacitive feedback path such that a first amplified charge is stored on the second capacitor during the holding phase. The third capacitor is configured to provide a second capacitive feedback path during the sampling phase and discharge during the holding phase. The amplifier is configured to amplify the transferred sampled charge during the holding phase, wherein the amplifier has a first frequency response during the holding phase. The amplifier is configured to buffer the amplified charge during the sampling phase, wherein the amplifier has a second frequency response during the sampling phase. The second frequency response has a bandwidth that is wider than a bandwidth of the first frequency response. The bandwidth of the first and second frequency responses is adjusted in response to a bias current of the amplifier.

According to another aspect of the invention, a method for amplifying a signal comprises storing a sampled charge that is associated with an input signal during a sampling phase on a first capacitor. The sampled charge is transferred from the first capacitor during the holding phase. A first capacitive feedback path is provided through which a first amplified charge is stored on a second capacitor during the holding phase. A second capacitive feedback path is provided during the sampling phase. The transferred sampled charge is amplified using the first capacitive feedback path during the holding phase, wherein the amplifying is associated with a first frequency response. The stored first amplified charge is buffered using the second capacitive feedback path during the sampling phase, wherein the buffering is associated with a second frequency response that has a bandwidth that is wider than a bandwidth of the first frequency response.

A more complete appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENTS

Figure 1:
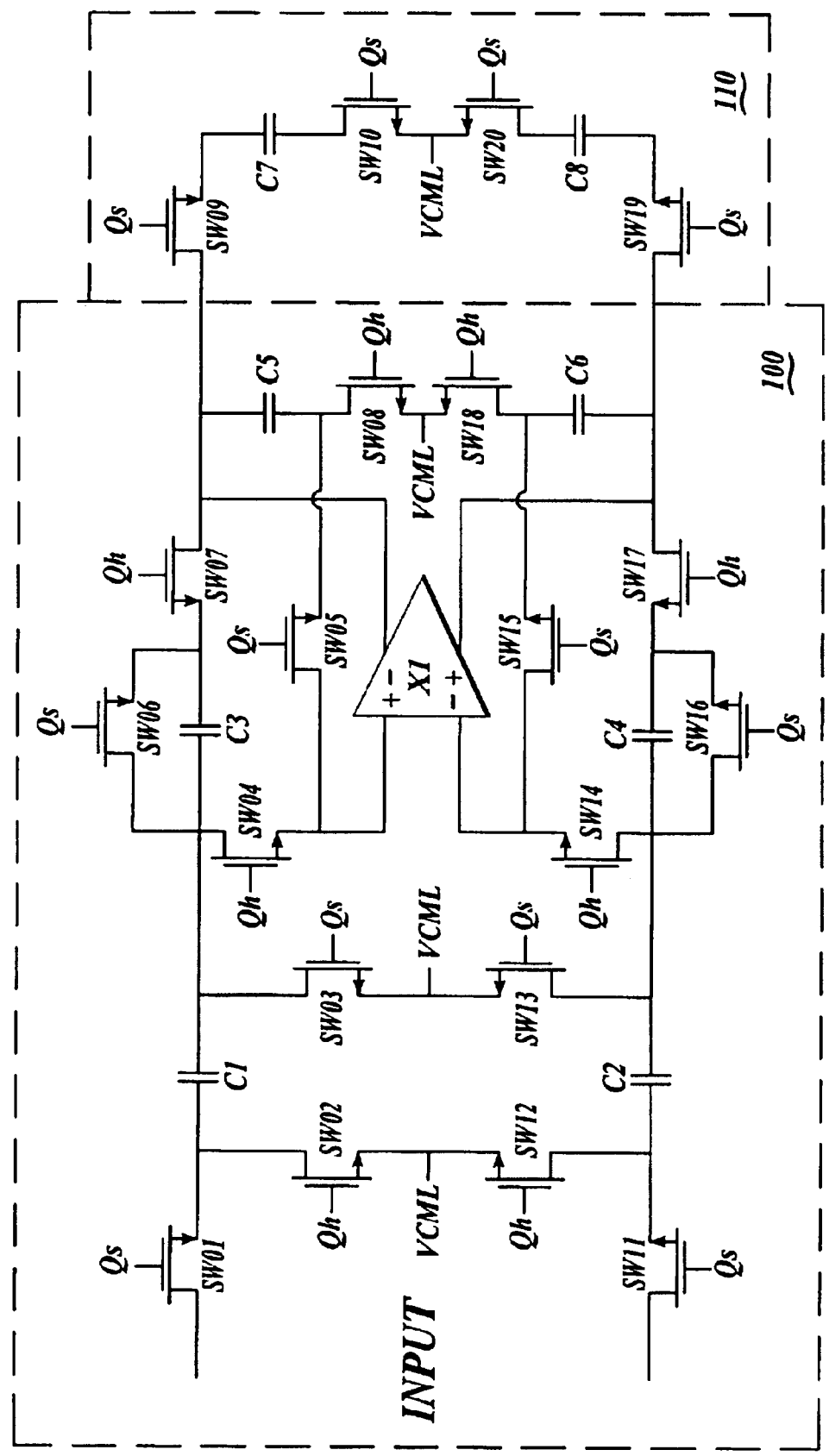
FIG. 1 is a schematic of an example single stage switched capacitor high voltage gain amplifier in accordance with the present invention.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in " and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

Switched capacitor amplifiers typically operate with at least two phases, which include a sampling phase and a holding phase. During the sampling phase, conventional amplifiers are configured in an open loop configuration to increase input signal bandwidth and relax amplifier design constraints. During the sampling phase, conventional amplifiers are idle resulting in wasted power due to the amplifier's bias ("quiescent") current. During the holding phase, conventional amplifiers are configured to amplify a sampled input signal. The bandwidth of a conventional amplifier is often reduced during the holding phase because a sampling capacitor (of another input stage) is typically coupled to the output node of the conventional amplifier.

An embodiment of the present invention is directed towards a high gain and wide bandwidth switched capacitor amplifier with dynamic loading. Dynamic loading is used to reduce the capacitive load during a high gain phase (e.g., during a sampling phase) and to increase the capacitive load during a high feedback factor phase (e.g., during a holding phase). The capacitive load may be provided by an external capacitive load such as a sampling capacitor of a subsequent stage or sampling device. A low feedback factor provides a high voltage gain and the lower capacitive load. A high feedback factor increases the effective bandwidth of the amplifier by compensating for a unit gain bandwidth reduction that is due to high capacitive loading.

FIG. 1 is a schematic of an example single stage switched capacitor high voltage gain amplifier in accordance with the present invention. High voltage gain amplifier 100 includes capacitors C1–C6, switching circuits SW01–SW08 and SW11–SW18, and amplifier X1. Amplifier X1 amplifier such as a folded cascode amplifier. Alternatively, a higher gain amplifier, such as a gain boosted folded cascode amplifier, can be used for even higher performance. Example input circuit 110 shows an input of another circuit that is suitable for use with high voltage gain amplifier 100. Circuit 110 comprises switching circuits SW09, SW10, SW19, and SW20, and capacitors C7 and C8.

High voltage gain amplifier 100 is a differential amplifier having a differential input signal, which reduces noise by providing common mode noise rejection. Each half of the differential input signal is processed by the "positive input side" (i.e., the "top half" of high voltage gain amplifier 100) or the "negative input side" of high voltage gain amplifier 100. Node VCML is a common mode voltage, which is typically selected to be about half of the supply voltage. For simplicity, discussion related to the positive input side also applies to the negative input side unless the context clearly indicates otherwise. Also for simplicity, switching circuits coupled to node Qs are assumed in the discussion to be closed during the sampling phase and open during the holding phase. Likewise, switching circuits coupled to node Qh are assumed in the discussion to be open during the sampling phase and closed during the holding phase.

In an embodiment of the present invention, high voltage gain amplifier 100 is used to amplify a sampled input signal during a holding phase. During the holding phase, high voltage gain amplifier 100 is arranged to have a low feedback factor, which provides high gain amplification. A capacitive load is coupled to the output node during the holding phase, which reduces the bandwidth of the feedback circuit. The coupled capacitive load may be provided by a sampling capacitor (e.g., C7) of a subsequent stage or an additional sampling device (e.g., C5). During the sampling phase, high voltage gain amplifier 100 is arranged to have a high feedback factor (which is ideally close to unity), which conserves power.

The level of bias current (which contributes to significant power consumption in analog circuits) is determined by a selected feedback factor. The bandwidth ($\omega$) of high voltage gain amplifier 100 when arranged to provide −3 dB of feedback can be expressed as $$\omega = 2 \times \ln(2) \times b \times F_s$$

where b is the resolution of a system that includes high voltage gain amplifier $F_s$ is the operating frequency.

The unit gain bandwidth ($\omega_T$) of high voltage gain amplifier 100 can be expressed as $$\omega_T = \frac{\omega}{\beta} = \frac{g_m}{C_L}$$

where $\beta$ is the feedback factor, $g_m$ is the transconductance of a high voltage gain amplifier 100 input transistor, and $C_L$ is the output equivalent load. The output equivalent load helps provide loading and compensation that is similar to Miller compensation. The output equivalent load is dependent upon impedances that are typically provided by a sampling capacitor of the next stage, a feedback network, and the input of a common mode feedback circuit.

The transconductance of a high voltage gain amplifier 100 input transistor can be expressed as $$g_m \propto \sqrt{(W/L)_{input} \times I_B}$$

where W/L is the aspect ratio of the input transistor and $I_B$ is the bias current of the input transistor.

The bias current for a high voltage gain amplifier 100 input transistor can be expressed as $$I_B \propto \left(\frac{2 \times \ln(2) \times b \times F_s \times C_L}{\beta}\right)^2 \times (W/L)_{input}$$

Accordingly, the bias current is inversely quadratically proportional to the feedback factor ($\beta$). The bias current is minimized (quadratically) as the feedback factor approaches unity.

In operation, high voltage gain amplifier 100 is configured to have a sampling phase and a holding phase. During the sampling phase, the positive side of an analog input signal is sampled by capacitor C1 in response to switching circuits SW01 and SW03 being closed. The charge on feedback capacitor C1 is reset in response to switching circuit SW01 being closed. Feedback capacitor C3 is typically reset to avoid problems associated with memory effects that may result from a residual charge being stored on feedback capacitor C3 during the previous holding phase. A charge on capacitor C5 (stored thereon during the previous holding period) is transferred to capacitor C7 in response to closing switching circuits SW05, SW09, and SW10.

The charge on capacitor C5 is amplified by amplifier X1 (using a feedback path that is associated with capacitor C5) in response to closing switching circuits SW05 and SW09. The feedback factor of the feedback path is typically nearly unity because of limited capacitance in the feedback path. A small amount of parasitic capacitance is usually present in the input of amplifier X1, which prevents the feedback factor from completely achieving unity. However, a feedback factor of less than unity does not prevent the total transfer function from being exactly unity gain. The operation of the sampling phase of high voltage gain amplifier 100 is further described below with respect to FIG. 2.

During the holding phase, the charge on sampling capacitor C1 is transferred to feedback capacitor C3 in response to closing switching circuits SW03 and SW04. The output of amplifier X1 is sampled by output sampling capacitor C5 in response to closing switching circuit SW08. Sampling capacitor C1 is selected to be larger than feedback capacitor C3, enabling amplifier X1 to have a higher voltage gain during the holding phase. The higher voltage gain reduces the bandwidth of the feedback path provided by capacitor C3.

In an example of the, present invention, the next stage sampling capacitors are not coupled to the output of amplifier X1 during the holding phase. Coupling the next stage sampling capacitors to the output of amplifier X1 reduces the bandwidth or the amplifier, which is arranged in an open loop configuration. In order to compensate for the attenuation caused by the output capacitor loading, a considerably larger bias current would be required.

Output sampling capacitor C5 (and C6, for the negative input side) is arranged to sample the output of amplifier X1. Output sampling capacitor C5 is selected to be smaller than the sampling capacitors of a next stage (sampling capacitor C7, for example). This allows the amplifier output to be sampled without having undesirable loading caused by relatively large sampling capacitors of a next stage. The operation of the holding phase of high voltage gain amplifier 100 is further described below with respect to FIG. 3.

Figure 2:
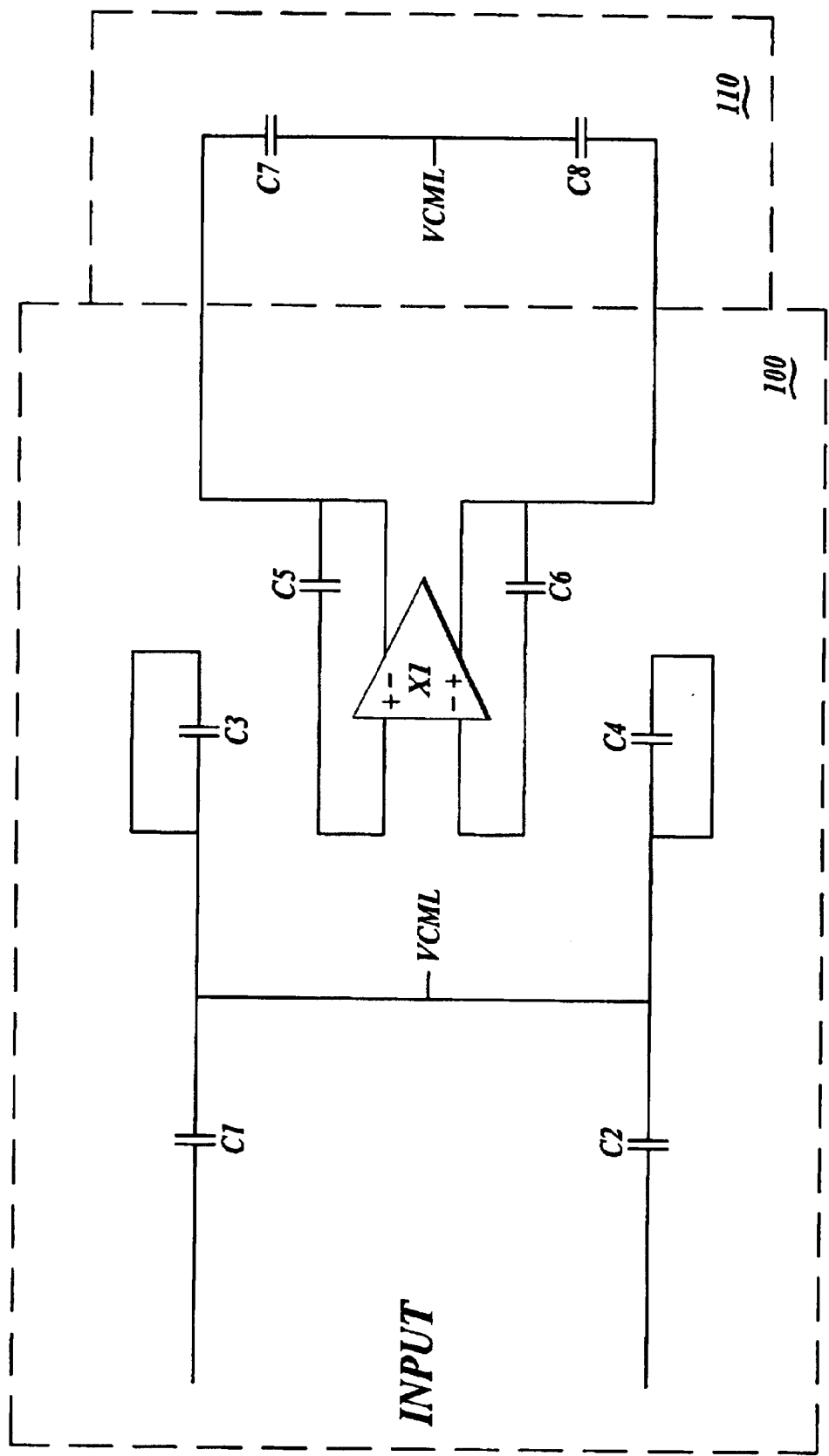
FIG. 2 is a schematic of an example single stage switched capacitor high voltage gain amplifier during a sampling phase in accordance with the present invention.

FIG. 2 is a schematic of an example single stage switched capacitor high voltage gain amplifier during a sampling phase in accordance with the present invention. During the sampling phase, the positive side of an analog input signal is sampled by capacitor C1. The charge on feedback capacitor C3 is reset. Feedback capacitor C3 is typically reset to avoid problems associated with memory effects that may result from a residual charge being stored on feedback capacitor C3. A charge on capacitor C5 (stored thereon during the previous holding period) is transferred to capacitor C7.

The charge on capacitor C5 is amplified by amplifier X1 (using a feedback path that is associated with capacitor C5). The feedback factor of the feedback path is ideally nearly unity because of limited capacitance in the feedback path. A small amount of parasitic capacitance is typically present in the input of amplifier X1, which prevents the feedback factor from completely achieving unity. The gain factor (which is the multiplicative inverse of the feedback factor) is typically unity, which results in the bandwidth of amplifier X1 being slightly lower than the unity gain bandwidth expected from an open loop amplifier.

Figure 3:
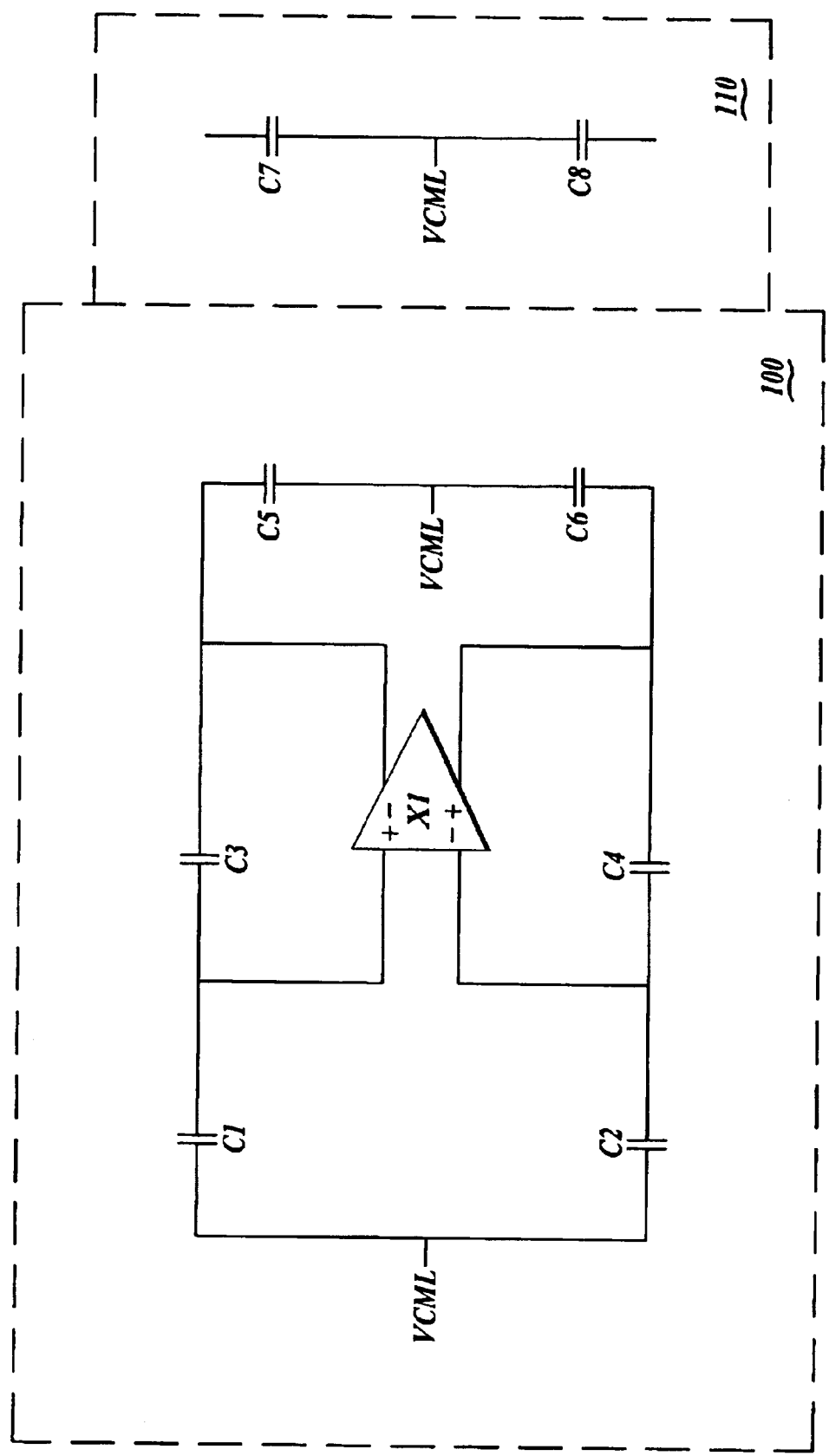
FIG. 3 is a schematic of an example single stage switched capacitor high voltage gain amplifier during a holding phase in accordance with the present invention.

FIG. 3 is a schematic of an example single stage switched capacitor high voltage gain amplifier during a holding phase in accordance with the present invention. During the holding phase, the charge on sampling capacitor C1 is transferred to feedback capacitor C3. The output of amplifier X1 is sampled by sampling capacitor C5. Sampling capacitor C1 is selected to be larger than feedback capacitor C3, enabling amplifier X1 to have a higher voltage gain during the holding phase. The higher voltage gain reduces the bandwidth of the feedback path provided by capacitor C3.

Output sampling capacitor C5 (and C6, for the negative input side) is arranged to sample the output of amplifier X1. Output sampling capacitor C5 is selected to be smaller than the sampling capacitors of a next stage (sampling capacitor C7, for example). This allows the amplifier output to be sampled without having undesirable loading caused by relatively large sampling capacitors of a next stage.

Figure 4:
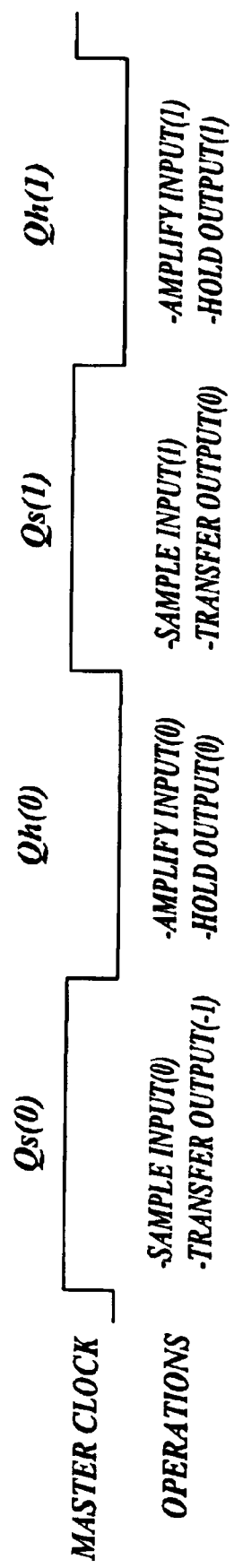
FIG. 4 is a timing diagram of signal flow in an example single stage switched capacitor high voltage gain amplifier in accordance with the present invention.

FIG. 4 is a timing diagram of signal flow in an example single stage switched capacitor high voltage gain amplifier in accordance with the present invention. The input signal is sampled during the sampling phase Qs(0). The sampled input signal is amplified during the holding phase Qh(0). The amplified signal (e.g., the output) is transferred to the next stage during sampling phase Qs(1). The amplified signal is transferred with amplifier X1 configured with a high feedback factor, which minimizes power consumption of amplifier X1. The transferred signal is held during holding phase Qh(1).

Figure 5:
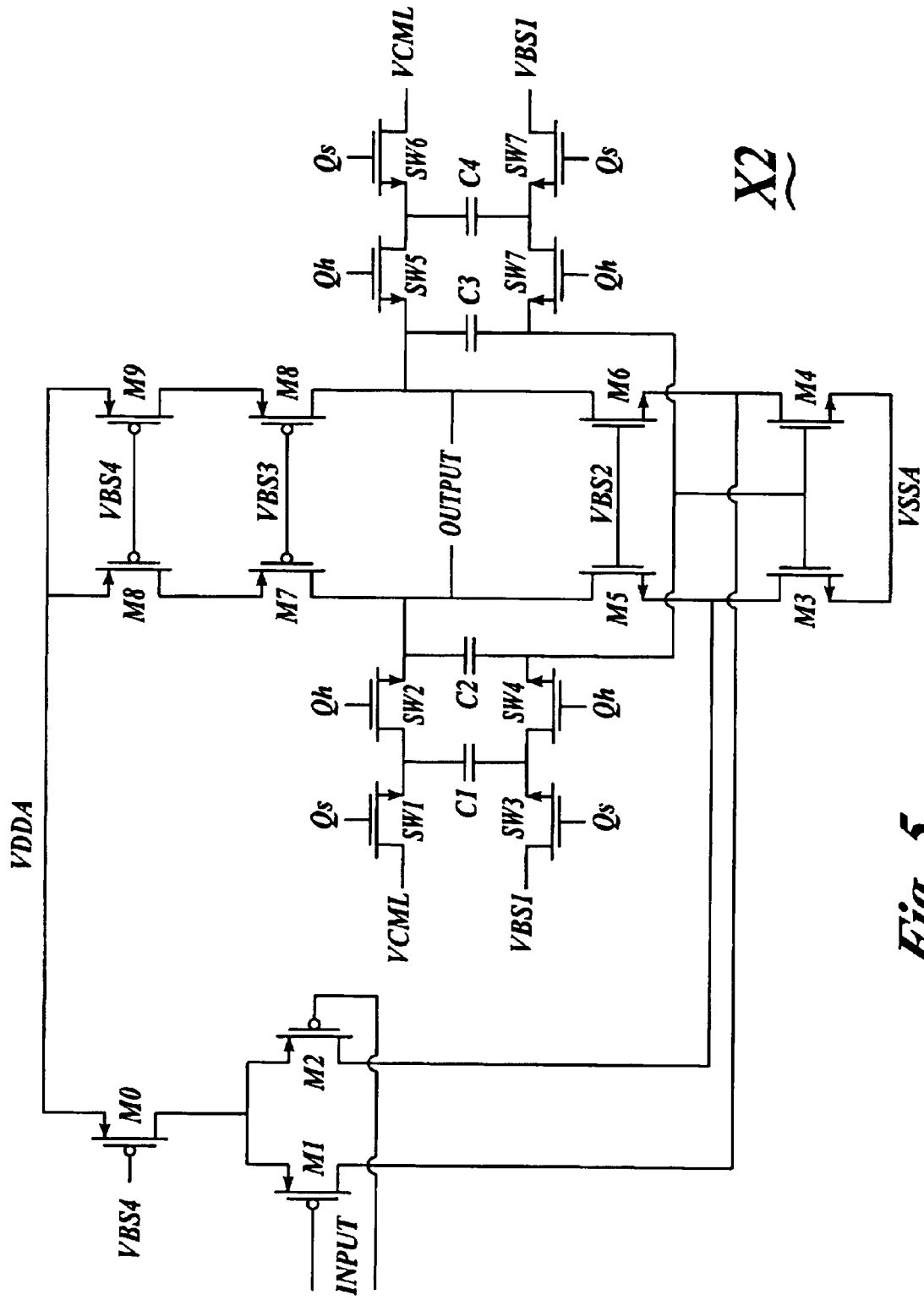
FIG. 5 is a schematic of an alternative example operational amplifier in accordance with the present invention.

FIG. 5 is a schematic of an alternative example operational amplifier in accordance with the present invention. Amplifier X2 is similar in operation to amplifier X1, while having certain differences in the control signal timing in the common mode feedback circuit. Common mode adjusting capacitors C21 and C24 are coupled to common mode holding capacitors C22 and C23 during the holding phase, reducing the output capacitive loading during the sampling phase. The output capacitive loading is reduced during the sampling phase when the output capacitance during the sampling phase is larger than the capacitance loading during the holding phase. The phases of the control signal timing can be reversed if the effective bandwidth during the holding phase is narrower than the effective bandwidth of the sampling phase. Additionally, a gain-boosting amplifier can be inserted to boost the DC gain of amplifier (by 100–1000 times, for example) when increased sampling resolution is desired.

Figure 6:
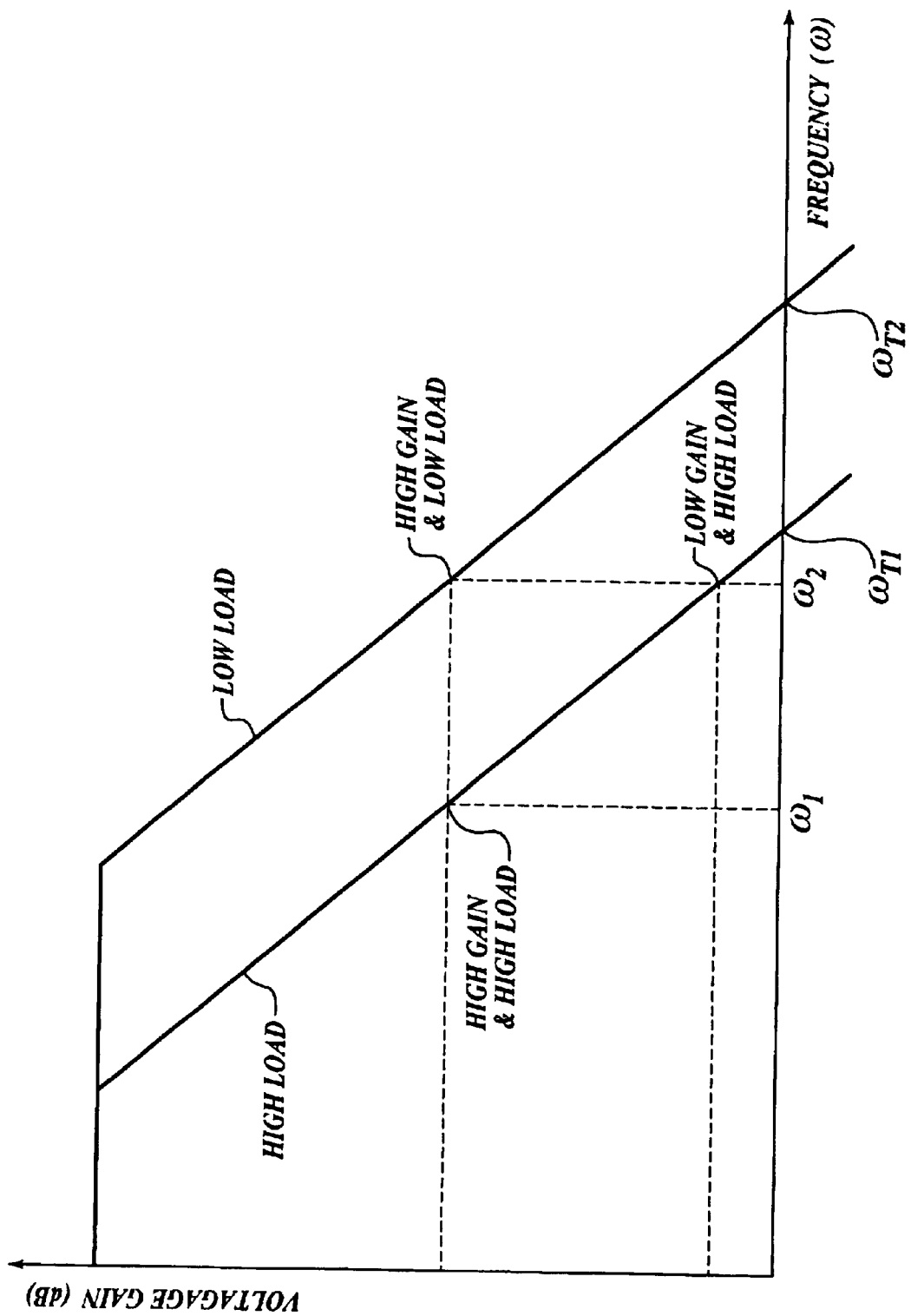
FIG. 6 is a graph that shows the frequency response of two circuits having different loading in accordance with the present invention.

FIG. 6 is a graph that shows the frequency response of two circuits having different loading in accordance with the present invention. Point $\omega_{T1}$, shows the unity gain bandwidth of an operational amplifier when a high capacitive load (such as the load provided by the sampling capacitor of a next stage) is coupled to the output node of the operational amplifier. Point $\omega_{T2}$ shows the unity gain bandwidth of an operational amplifier when a small capacitive load (such as the load provided by the output sampling capacitor C5) is coupled to the output node of the operational amplifier. Point $\omega_1$, shows the −3 dB point of the operational amplifier when a high capacitive load (such as the load provided by the sampling capacitor of a next stage) is coupled to the output node of the operational amplifier. Point $\omega_2$ shows the −3 dB point of the operational amplifier when a low capacitive load (such as the load provided by the output sampling capacitor) is coupled to the output node of the operational amplifier.

Other embodiments of the invention are possible without departing from the spirit and scope of the invention. For example, the common mode circuitry described above could be implemented as single-ended circuitry. The above specification, examples and data provide a complete description of the manufacture and use of the composition of the invention. Since many embodiments of the invention can be made without departing from the spirit and scope of the invention, the invention resides in the claims hereinafter appended.

I claim:

1. A switched capacitor high voltage gain amplifier circuit, comprising:
    a first capacitor that is configured to store a sampled charge that is associated with an input signal during a sampling phase and transfer the sampled charge during a holding phase;
    a second capacitor that is configured to discharge during the sampling phase and provide a first capacitive feedback path such that a first amplified charge is stored on the second capacitor during the holding phase;
    a third capacitor that is configured to provide a second capacitive feedback path during the sampling phase; and
    an amplifier that is configured to amplify the transferred sampled charge during the holding phase, and buffer the amplified charge during the sampling phase, wherein the amplifier has a first frequency response during the holding phase and a second frequency response during the sampling phase, wherein a bandwidth of the second frequency response is wider than a bandwidth of the first frequency response.

2. The circuit of claim 1, wherein the first capacitive feedback path has a first feedback factor, and the second capacitive path has a second feedback factor, wherein the second feedback factor is greater than the first feedback factor.

3. The circuit of claim 2, wherein the second feedback factor is substantially unity.

4. The circuit of claim 1, wherein an output of the amplifier is compensated by an external capacitive load.

5. The circuit of claim 1, wherein the third capacitor is further configured to transfer charge to a switched capacitor circuit.

6. The circuit of claim 1, wherein a mode adjusting capacitor is coupled to a common mode holding capacitor during the holding phase.

7. The circuit of claim 1, wherein a mode adjusting capacitor is coupled to a common mode holding capacitor during the sampling phase.

8. The circuit of claim 1, wherein the amplifier further comprises a bias current that is configured to adjust the bandwidth of the first and second frequency responses.

9. A circuit for amplifying a signal, comprising:
  means for storing a sampled charge that is associated with an input signal during a sampling phase on a first capacitor;
  means for transferring the sampled charge from the first capacitor during the holding phase;
  means for providing a first capacitive feedback path through which a first amplified charge is stored on a second capacitor during the holding phase;
  means for providing a second capacitive feedback path during the sampling phase;
  means for amplifying the transferred sampled charge using the first capacitive feedback path during the holding phase, wherein the amplifying is associated with a first frequency response; and
  means for buffering the stored first amplified charge using the second capacitive feedback path during the sampling phase, wherein the buffering is associated with a second frequency response that has a bandwidth that is wider than a bandwidth of the first frequency response.

10. The circuit of claim 9, wherein the first capacitive feedback path provides a first feedback factor, and the second capacitive path provides a second feedback factor that is greater than the first feedback factor.

11. The circuit of claim 9, wherein the second capacitive path provides a feedback factor that is substantially unity.

12. The circuit of claim 9, further comprising means for coupling a mode adjusting capacitor to a common mode holding capacitor during the holding phase.

13. The circuit of claim 9, further comprising means for coupling a mode adjusting capacitor to a common mode holding capacitor during the sampling phase.

14. The circuit of claim 9, further comprising means for adjusting a bias current in response to a clock phase whereby circuit bandwidth and circuit power consumption are adjusted.

15. A method for amplifying a signal, comprising:
  storing a sampled charge that is associated with an input signal during a sampling phase on a first capacitor,
  transferring the sampled charge from the first capacitor during the holding phase;
  providing a first capacitive feedback path through which a first amplified charge is stored on a second capacitor during the holding phase;
  providing a second capacitive feedback path during the sampling phase;
  amplifying the transferred sampled charge using the first capacitive feedback path during the holding phase, wherein the amplifying is associated with a first frequency response; and
  buffering the stored first amplified charge using the second capacitive feedback path during the sampling phase, wherein the buffering is associated with a second frequency response that has a bandwidth that is wider than a bandwidth of the first frequency response.

16. The method of claim 15, wherein the first capacitive feedback path provides a first feedback factor, and wherein the second capacitive path provides a second feedback factor that is greater than the first feedback factor.

17. The method of claim 16, wherein the second capacitive path provides a feedback factor that is substantially unity.

18. The method of claim 15, further comprising compensating an output of an amplifier by using an external capacitive load.

19. The method of claim 15, further comprising coupling a mode adjusting capacitor to a common mode holding capacitor during the holding phase.

20. The method of claim 15, further comprising coupling a mode adjusting capacitor to a common mode holding capacitor during the sampling phase.

* * * * *

UNITED STATES PATENT AND TRADEMARK OFFICE
CERTIFICATE OF CORRECTION

PATENT NO. : 6,778,009 B1
DATED : August 17, 2004
INVENTOR(S) : Bumha Lee

It is certified that error appears in the above-identified patent and that said Letters Patent is hereby corrected as shown below:

Column 3,
Line 20, after "Amplifier X1" insert -- is typically a high performance --.
Line 65, after "amplifier" insert -- 100 and --.

Column 4,
Line 35, change "C1" to -- C3 --; change "SW01" to -- SW06 --.

Signed and Sealed this

Fifth Day of July, 2005

JON W. DUDAS
*Director of the United States Patent and Trademark Office*